(12) United States Patent
Kang et al.

(10) Patent No.: US 10,014,146 B2
(45) Date of Patent: Jul. 3, 2018

(54) ELECTRON BEAM EMISSION DEVICE

(71) Applicant: KOREA INSTITUTE OF INDUSTRIAL TECHNOLOGY, Cheonan-si, Chungcheongnam-do (KR)

(72) Inventors: Eun Goo Kang, Seoul (KR); Seok Woo Lee, Seongnam-si (KR); Hon Zong Choi, Seoul (KR)

(73) Assignee: KOREA INSTITUTE OF INDUSTRIAL TECHNOLOGY, Chungcheongnam-Do (KR)

( * ) Notice: Subject to any disclaimer, the term of this patent is extended or adjusted under 35 U.S.C. 154(b) by 0 days.

(21) Appl. No.: 15/508,932

(22) PCT Filed: Dec. 19, 2014

(86) PCT No.: PCT/KR2014/012577
§ 371 (c)(1),
(2) Date: Mar. 6, 2017

(87) PCT Pub. No.: WO2016/035942
PCT Pub. Date: Mar. 10, 2016

(65) Prior Publication Data
US 2017/0263411 A1 Sep. 14, 2017

(30) Foreign Application Priority Data

Sep. 5, 2014 (KR) .................. 10-2014-0119183
Sep. 5, 2014 (KR) .................. 10-2014-0119186

(51) Int. Cl.
*H01J 29/84* (2006.01)
*H01J 29/04* (2006.01)
*H01J 29/00* (2006.01)

(52) U.S. Cl.
CPC ............ *H01J 29/84* (2013.01); *H01J 29/006* (2013.01); *H01J 29/04* (2013.01); *H01J 2229/0069* (2013.01); *H01J 2229/4831* (2013.01)

(58) Field of Classification Search
CPC .......... H01J 29/84; H01J 29/006; H01J 29/04
See application file for complete search history.

(56) References Cited

U.S. PATENT DOCUMENTS

| 8,547,005 B1 | 10/2013 | Smith et al. |
| 2002/0014827 A1 | 2/2002 | An |
| 2004/0206919 A1 | 10/2004 | Okunuki et al. |
| 2007/0145304 A1 | 6/2007 | Roche et al. |
| 2013/0162134 A1 | 6/2013 | Mattausch et al. |

OTHER PUBLICATIONS

International Search Report for PCT/KR2014/012577 dated May 8, 2015 from Korean Intellectual Property Office.

*Primary Examiner* — Anne Hines
(74) *Attorney, Agent, or Firm* — Cantor Colburn LLP (57) ABSTRACT

Disclosed is an electron beam emission device comprising a housing which defines a space in which electron beams are accelerated, and has an opening at the other side thereof through which the electron beams are emitted; a cathode which is disposed at one side in the housing, and emits the electrons; an anode which is positioned in the housing so as to be spaced apart from the cathode toward the other side, and accelerates the electrons emitted from the cathode; and an insulation holder which insulates a portion between the cathode and the housing, and fixes the cathode, wherein the cathode has a surface which faces the anode and is formed concavely to have a gradient, and a rim of the surface of the cathode, which has the gradient, is formed to be rounded.

18 Claims, 6 Drawing Sheets

ELECTRON BEAM EMISSION DEVICE

CROSS REFERENCE TO PRIOR APPLICATIONS

This application is a National Stage Application of PCT International Patent Application No. PCT KR2014/012577 filed on Dec. 19, 2014, under 35 U.S.C. § 317, which claims priority to Korean Patent Application Nos. 10-2014-0119183 filed on Sep. 5, 2014 and 10-2014-0119186 filed on Sep. 5, 2014, which are all hereby incorporated by reference in their entirety.

TECHNICAL FIELD

The present application relates to an electron beam emission device provided with a reflection electron blocking structure, and more particularly, to an electron beam emission device provided with a reflection electron blocking structure which is capable of operating more stably and producing a high output.

BACKGROUND ART

An electron beam emission device refers to a device for performing various processing, such as melting or reforming of a surface of a processed product, by emitting electrons by using high energy, and recently, the electron beam emission device is applied to various processing device fields in addition to an image display means or a non-destructive inspection device.

In general, as the electron beam emission device, a thermal type electron beam emission device, which emits electron beams by applying high voltage and high current to a filament, is used, but there are difficulties in maintaining a high degree of vacuum and manufacturing the filament, which directly causes problems with maintenance of the device.

Meanwhile, a cold type electron beam emission device, which is contrasted with the thermal type electron beam emission device, has been introduced. Various types of the cold type electron beam emission device have also been introduced.

Figure 1:
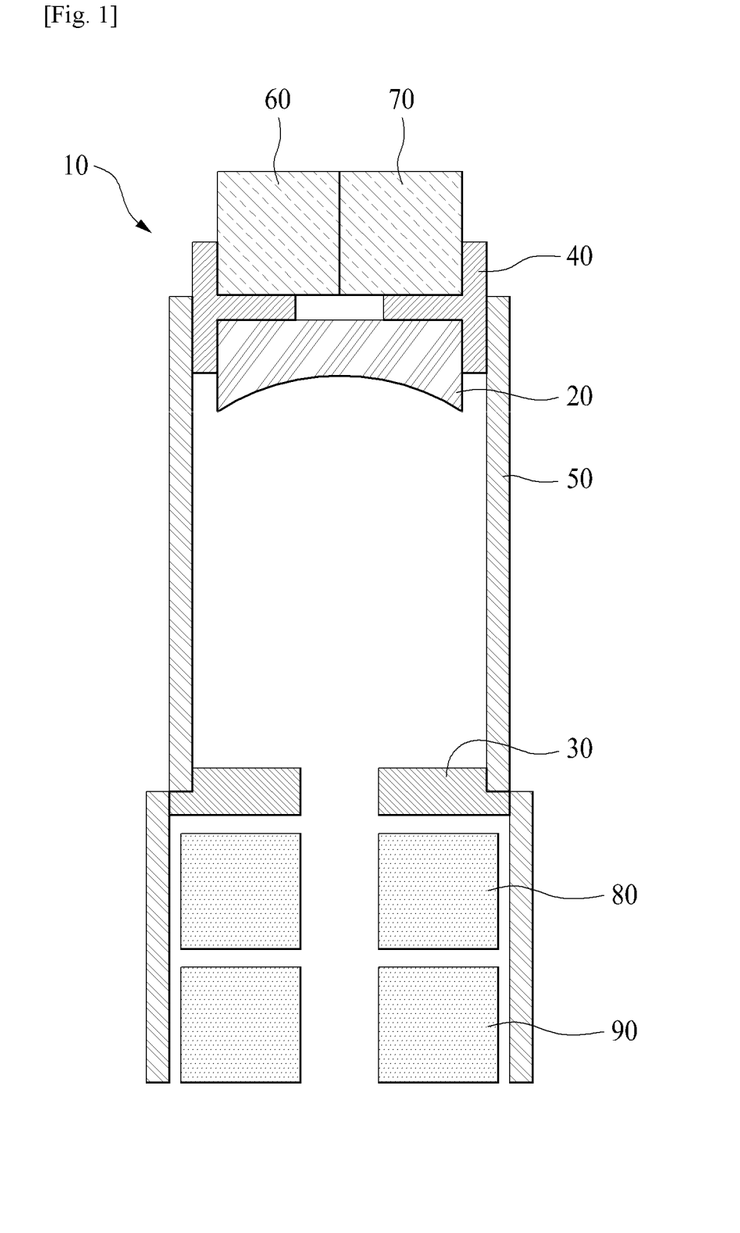
FIG. 1 is a cross-sectional view illustrating a typical electron beam emission device in the related art.

FIG. 1 is a view illustrating an electron beam emission device using a concave cathode among the cold type electron beam emission devices.

As illustrated in FIG. 1, an electron beam emission device in the related art may include a cathode 20, an anode 30, an insulation unit 40, and a tube 50.

The cathode 20 is disposed at one end of the tube 50, and a downward surface of the cathode 20 has a gradient so as to be concave.

Further, the anode 30 is disposed at the other end in the tube 50, and disposed to be spaced apart from the cathode 20.

The cathode 20 is fixed to the tube 50 by the insulation unit 40, and a drive unit 60 for controlling electrical energy applied to the cathode 20 and a cooling unit 70 for cooling the cathode 20 are provided outside the insulation unit 40.

Meanwhile, the tube 50 is made of a quartz material which enables an internal state to be observed, withstands a high temperature, and enables insulation.

In addition, a focusing unit 80 and a deflecting unit 90 are installed at a lower side of the anode 30, thereby focusing and deflecting the emitted electron beams.

Therefore, the electrons emitted from the cathode 20 may form the electron beams while being accelerated and emitted by the anode 30, and may be focused while passing through the focusing unit 80, and an emission direction of the electrons may be deflected while the electrons pass through the deflecting unit 90.

However, the aforementioned electron beam emission device in the related art has the following problems.

Figure 2:
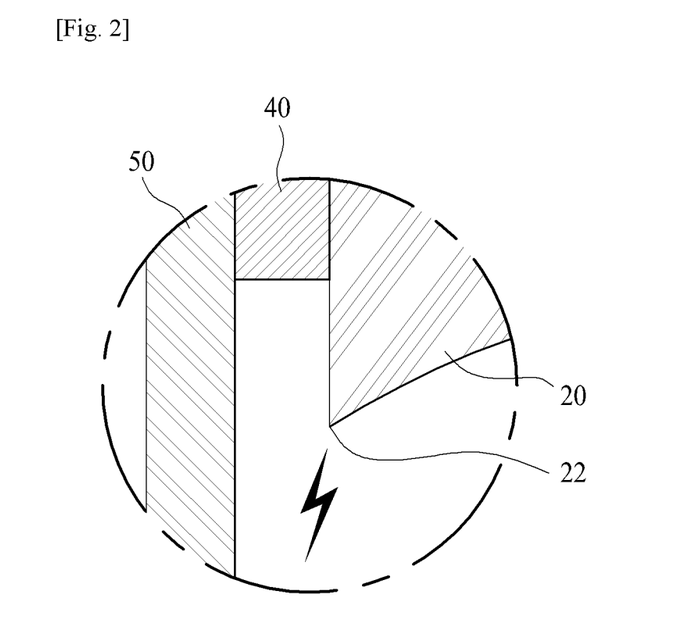
FIG. 2 is a cross-sectional view illustrating an enlargement of a part of FIG. 1.

First, because a rim 22 of the cathode 20 is formed in the form of a pointed end as illustrated in FIG. 2, an arc is generated at the rim 22 of the cathode 20 when high energy is applied such that the electron beam emission device 10 operates unstably, and as a result, there is a limitation in increasing an output.

Second, since a tube made of a quartz material is used as the tube 50, there is a problem in that the tube 50 is easily damaged due to impact applied when the device operates and repeated thermal shock.

Third, in a case in which metal is processed as a processing object to be processed by the electron beam emission device 10, metal vapor (fume) vaporized by the electron beams may be adhered and deposited on the tube, and the deposited metal vapor generates an arc when the electron beam emission device operates, and thus acts as a factor that limits use duration time of the tube.

Fourth, radioactive rays such as X-rays, which are harmful to a human body, may be generated when the electrons are reflected by the anode 30, but the tube made of a quartz material cannot block the radioactive rays, and as a result, there is a problem in that an environment harmful to an operator may be made.

Fifth, some of the electron beams emitted from the cathode 20 are not directed toward the anode, and may form backscattered electrons (BSE) that are directed in other directions.

Further, secondary electrons 9 may be emitted as elements such as nitrogen in the tube 50 collide with the accelerated electrons, and the secondary electrons 9 are scattered without being focused in comparison with the electron beams emitted from the cathode 20, and may be reflected in the tube 50 without passing through the anode 30.

In the following description, both of the backscattered electron and the secondary electron are referred to as a reflection electron.

Even though the reflection electron 9 does not have high energy, the reflection electron 9 may become a factor that serves to increase a temperature in the tube 50 by being reflected in the tube 50, or hinders a stable operation while generating an arc.

DISCLOSURE

Technical Problem

The present application has been made in an effort to solve the problems, and an object of the present application is to provide an electron beam emission device capable of more stably operating over a long period of time and producing a high output.

In addition, another object of the present application is to provide an electron beam emission device capable of more stably operating over a long period of time by inhibiting reflection electrons from being reflected back into the tube.

Technical Solution

To achieve the objects, an aspect of the present application provides an electron beam emission device including: a housing which defines a space in which electron beams are accelerated, and has an opening at the other side thereof through which the electron beams are emitted; a cathode which is disposed at one side in the housing, and emits the electrons; an anode which is positioned in the housing so as to be spaced apart from the cathode toward the other side, and accelerates the electrons emitted from the cathode; and an insulation holder which insulates a portion between the cathode and the housing, and fixes the cathode, in which the cathode has a surface which faces the anode and is formed concavely to have a gradient, and a rim of the surface of the cathode, which has the gradient, is formed to be rounded.

The insulation holder may be formed to surround a rear surface of the surface of the cathode which has the gradient, surround a lateral surface of the cathode, and extend to the rounded portion of the rim of the cathode.

A surface of the cathode, which faces the anode, may be disposed to be closer to the anode than the insulation holder.

A tube, which is made of a metallic material and defines a lateral surface of the housing, may be provided.

The tube may be insulated from the cathode, and grounded.

A cooling unit, which cools the cathode in an air-cooled manner, may be further provided between the cathode and the insulation holder.

The cooling unit may include an upper plate and a lower plate, and a flow path through which air flows may be formed between the upper plate and the lower plate.

The electron beam emission device may further include a reflection electron blocking structure which is disposed in the housing, is formed to extend toward the anode from the periphery of an emission port of the housing, and blocks secondary electrons and backscattered electrons, which are reflected at the periphery of the emission port of the housing, from being reflected into the housing.

The reflection electron blocking structure may be disposed between the anode and a surface of the housing in which the emission port is formed, may extend toward the anode from the surface in which the emission port is formed, may have an internal hollow portion, and may be formed in the form of a tube that is opened at a side directed toward the anode and at a side directed toward the emission port.

The internal hollow portion of the reflection electron blocking structure may communicate with the emission port, and may have a diameter larger than a diameter of the emission port.

A flange portion, which extends inward from an inner circumferential surface of the reflection electron blocking structure, may be further formed.

A diameter of an opening formed by an inner circumferential surface of the flange portion may have a magnitude that allows metal vapor flowing upward through the emission port to be guided to the cathode.

A plurality of absorbing grooves, which absorbs the backscattered electrons and the secondary electrons, may be formed in an inner circumferential surface of the reflection electron blocking structure.

A cooling pipe through which a cooling medium flows may be provided on an outer circumferential surface of the reflection electron blocking structure.

A blocking plate, which blocks the electrons from being emitted directly to the cooling pipe, may be further provided outside the cooling pipe.

Meanwhile, another aspect of the present application provides an electron beam emission device including: a housing which defines a space in which electron beams are accelerated, and has an emission port at the other side thereof through which the accelerated electron beams are emitted; a cathode which is disposed at one side in the housing, and emits the electrons; an anode which is positioned in the housing so as to be spaced apart from the cathode toward the other side, and accelerates the electrons emitted from the cathode; and a reflection electron blocking structure which is disposed in the housing, is formed to extend toward the anode from the periphery of the emission port of the housing, and blocks secondary electrons and backscattered electrons, which are reflected at the periphery of the emission port of the housing, from being reflected into the housing.

The reflection electron blocking structure may be disposed between the anode and a surface of the housing in which the emission port is formed, may extend toward the anode from the surface in which the emission port is formed, may have an internal hollow portion, and may be formed in the form of a tube that is opened at a side directed toward the anode and at a side directed toward the emission port.

The internal hollow portion of the reflection electron blocking structure may communicate with the emission port, and may have a diameter larger than a diameter of the emission port, and a flange portion, which extends inward from an inner circumferential surface of the reflection electron blocking structure, may be further formed.

A plurality of absorbing grooves, which absorbs the backscattered electrons and the secondary electrons, may be formed in an inner circumferential surface of the reflection electron blocking structure.

Advantageous Effects

The electron beam emission device of the present application has the following effects.

First, since the rim of the cathode is not formed in the form of a pointed end, the occurrence of an arc is inhibited, and as a result, it is possible to more stably operate the electron beam emission device, and to further increase a critical output.

Second, since a space in which charges are stored is reduced as an interval between the cathode and the insulation holder is reduced, such that a capacitance between the cathode and the insulation holder is reduced, the occurrence of an arc is inhibited, and as a result, it is possible to more stably operate the electron beam emission device, and to further increase a critical output.

Third, since the tube is made of a metallic material, there is no concern that the tube is damaged due to thermal shock such as thermal expansion and thermal contraction, and impact applied from the outside, and since the tube is grounded, the occurrence of an arc caused by fume is inhibited, and as a result, it is possible to increase a critical output, and increase a lifespan of the device.

Fourth, since the tube is made of a metallic material, X-rays, which are generated when the electrons are reflected at the anode, may be blocked, and as a result, it is possible to improve safety for an operator.

Fifth, it is possible to maximally inhibit an increase in temperature in the housing by blocking the backscattered electrons and the secondary electrons from being reflected back in the housing, and it is also possible to prevent an arc from being generated due to the reflected electrons, and as a result, the electron beam emission device may more stably operate over a long period of time and may produce a high output.

The effects of the present invention are not limited to the aforementioned effects, and other effects, which are not mentioned above, will be clearly understood by those skilled in the art from the claims.

BEST MODE

Hereinafter, an exemplary embodiment of the present invention for specifically accomplishing the objects of the present invention will be described with reference to the accompanying drawings. In the description of the present exemplary embodiment, like terms and like reference numerals are used for like configurations, and additional descriptions will be omitted.

Figure 3:
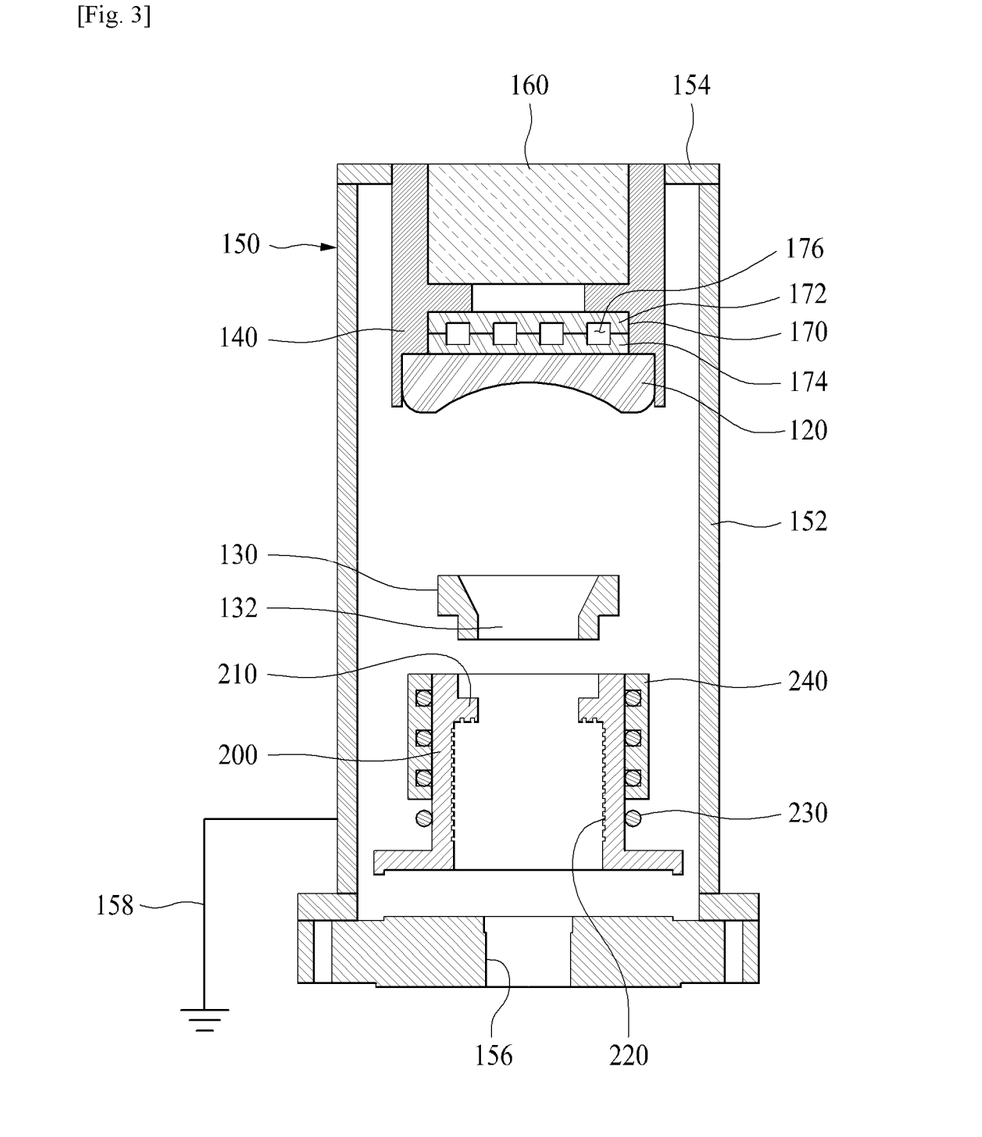
FIG. 3 is a cross-sectional view illustrating an example of an electron beam emission device according to an exemplary embodiment of the present application.

As illustrated in FIG. 3, an electron beam emission device 100 according to the present exemplary embodiment may include a housing 150, a cathode 120, an anode 130, and an insulation holder 140.

The housing 150 is a constituent element which defines a space in which the cathode 120 and the anode 130, which will be described below, are positioned and electron beams are accelerated, and an emission port 156, through which the accelerated electron beams are emitted, may be formed at the other side of the housing 150, and an interior of the housing 150 may be in a vacuum atmosphere.

Further, the cathode 120 is provided at one side in the housing 150. The cathode 120 is a constituent element which emits the electrons by receiving electrical energy, and in the present exemplary embodiment, an example in which the cathode 120 is made of a metallic material and has an entirely circular plate shape having a predetermined thickness will be described.

In the housing 150, the anode 130 may be positioned to be spaced apart from the cathode 120 toward the other side. The anode 130 is a constituent element which accelerates the electrons emitted from the cathode 120 by receiving electrical energy, and may have an opening 132 through which the accelerated electrons pass.

Meanwhile, the insulation holder 140 is a constituent element which insulates a portion between the cathode 120 and the housing 150, and fixes the cathode 120 to the housing 150.

In addition, a drive unit 160, which supplies electrical energy to the cathode 120 or the anode 130, and a cooling unit 170, which cools the cathode 120, may be provided at one side of the insulation holder 140.

Further, although not illustrated in the drawings, a focusing unit (not illustrated) or a deflecting unit (not illustrated), which focuses or deflects the electron beam passing through the opening 132 of the anode 130, may be provided at the other side of the anode 130.

Therefore, when electrical energy is applied to the cathode 120 and the anode 130, the electrons may be emitted from the cathode 120, accelerated toward the anode 130, and then emitted through the emission port 156 of the housing 150.

Figure 4:
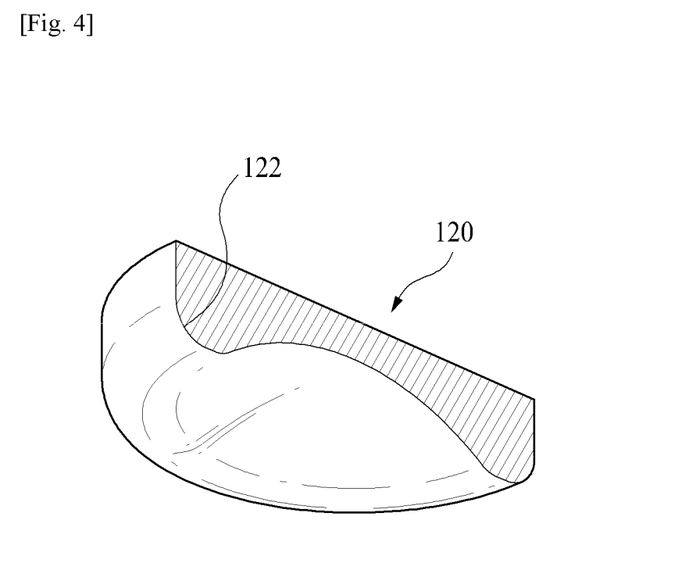
FIG. 4 is a cross-sectional perspective view illustrating a cathode in FIG. 3.

Meanwhile, as illustrated in FIGS. 3 and 4, a surface of the cathode 120, which faces the anode 130, may be formed concavely to have a gradient.

Further, a rim 122 of the surface of the cathode 120, which has the gradient, may be formed to be rounded.

Therefore, a pointed end portion is not formed at the rim of the cathode 120, and as a result, the occurrence of an arc is prevented, and a more stable operation is enabled.

Further, the insulation holder 140 is formed to surround a rear surface of the surface of the cathode 120 which has the gradient, and surround a lateral surface of the cathode 120, and a portion of the insulation holder 140, which surrounds the lateral surface of the cathode 120, may be formed to extend to the rounded portion 122 of the rim of the cathode.

Figure 5:
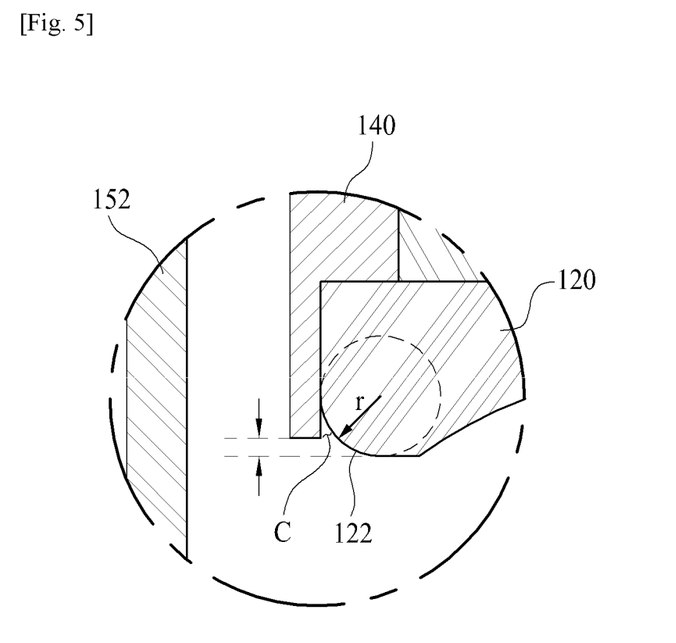
FIG. 5 is a cross-sectional view illustrating an enlargement of a part of FIG. 3.

In addition, as illustrated in FIG. 5, since the insulation holder 140 extends to the lateral surface of the cathode 120, the occurrence of an arc may be prevented between the housing 150 and the cathode 120.

In this case, the insulation holder 140 may be formed to extend so as to surround a part of the rounded portion of the rim 122 of the cathode.

That is, the cathode 120 may be positioned to be closer to the anode 130 than the insulation holder 140.

As described above, since the rim of the cathode 120 is formed to be rounded, a space C may be formed between the insulation holder 140 and the cathode 120, and in this case, the space C serves as a space in which charges are accumulated, and as a result, an arc may be generated when the electron beam emission device operates.

Therefore, since the cathode 120 is positioned to be closer to the anode 130 than the insulation holder 140, an interval between the cathode 120 and the insulation holder 140 is decreased, and the space C in which charges are accumulated may be reduced.

Therefore, a capacitance between the cathode 120 and the insulation holder 140 is reduced, such that the occurrence of an arc is inhibited, and as a result, it is possible to more stably operate the electron beam emission device, and to further increase a critical output.

Meanwhile, the housing 150 may include a tube 152 which defines a circumference of a lateral surface of the housing 150.

In this case, the tube 152 may be made of a metallic material, and may be insulated from the cathode 120. To this end, an insulator 154 may be provided between the tube 152 and the cathode 120.

Further, the tube 152 may be grounded 158.

In a case in which metal is processed by the electron beam emission device, metal vapor is generated from molten metal, and the generated metal vapor may be deposited on an inner surface of the tube 152.

In this case, since the tube 152 is grounded 158, the electrons at the periphery of the metal vapor attached to the inner surface of the tube 152 flow to the ground where the tube is grounded 158, such that the occurrence of an arc is prevented, and as a result, it is possible to more stably operate the electron beam emission device, and to increase a critical output.

In addition, because of the nature of the metallic material, the electron beam emission device is strong against external impact and repeated thermal shock, and may be operated even though the attached metal vapor is not removed, and as a result, the electron beam emission device may be used semipermanently.

In addition, radioactive rays such as X-rays, which are harmful to a human being, may be generated when the electrons are reflected by the anode or the like, but since the tube is made of a metallic material, and as a result, it is possible to block the radioactive rays and thus to improve safety for the operator.

In addition, as illustrated in FIG. 3, the cooling unit 170 includes an upper plate 172 and a lower plate 174, and a flow path 176, through which air flows, may be formed in the cooling unit 170. In addition, the flow path 176 is connected to an external cooling air supply device (not illustrated) such that outside air is circulated, and as a result, the cathode 120 may be cooled in an air-cooled manner.

In a case in which the cathode 120 is cooled in a water-cooled manner using a coolant, an electric current leak phenomenon in which the electric current to be applied to the cathode 120 flows to the coolant may occur, in spite of the insulation, when high voltage is applied to the cathode 120, but in the present application, since the cathode 120 is cooled in an air-cooled manner, it is possible to avoid the electric current leak phenomenon.

Further, a reflection electron blocking structure 200 may be provided.

Figure 6:
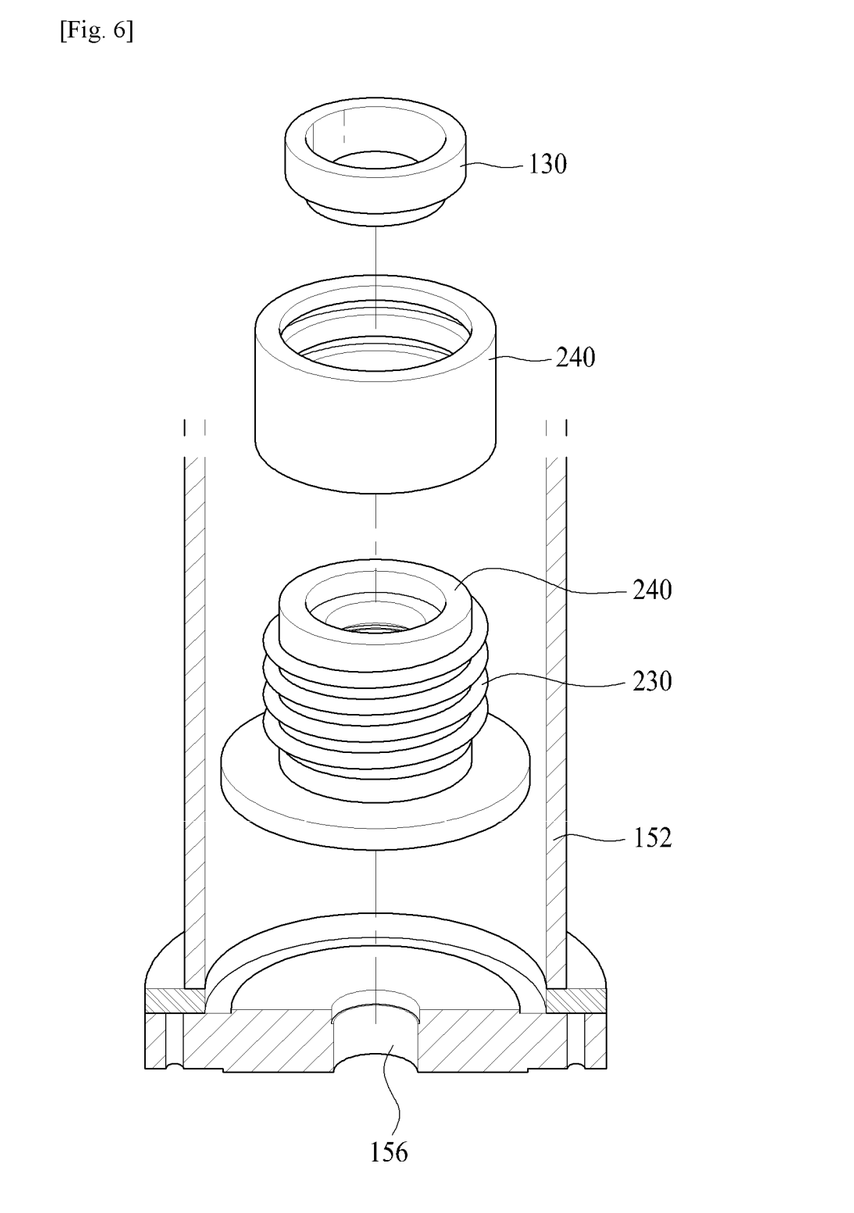
FIG. 6 is an exploded perspective view illustrating a reflection electron blocking structure in FIG. 3.
Figure 7:
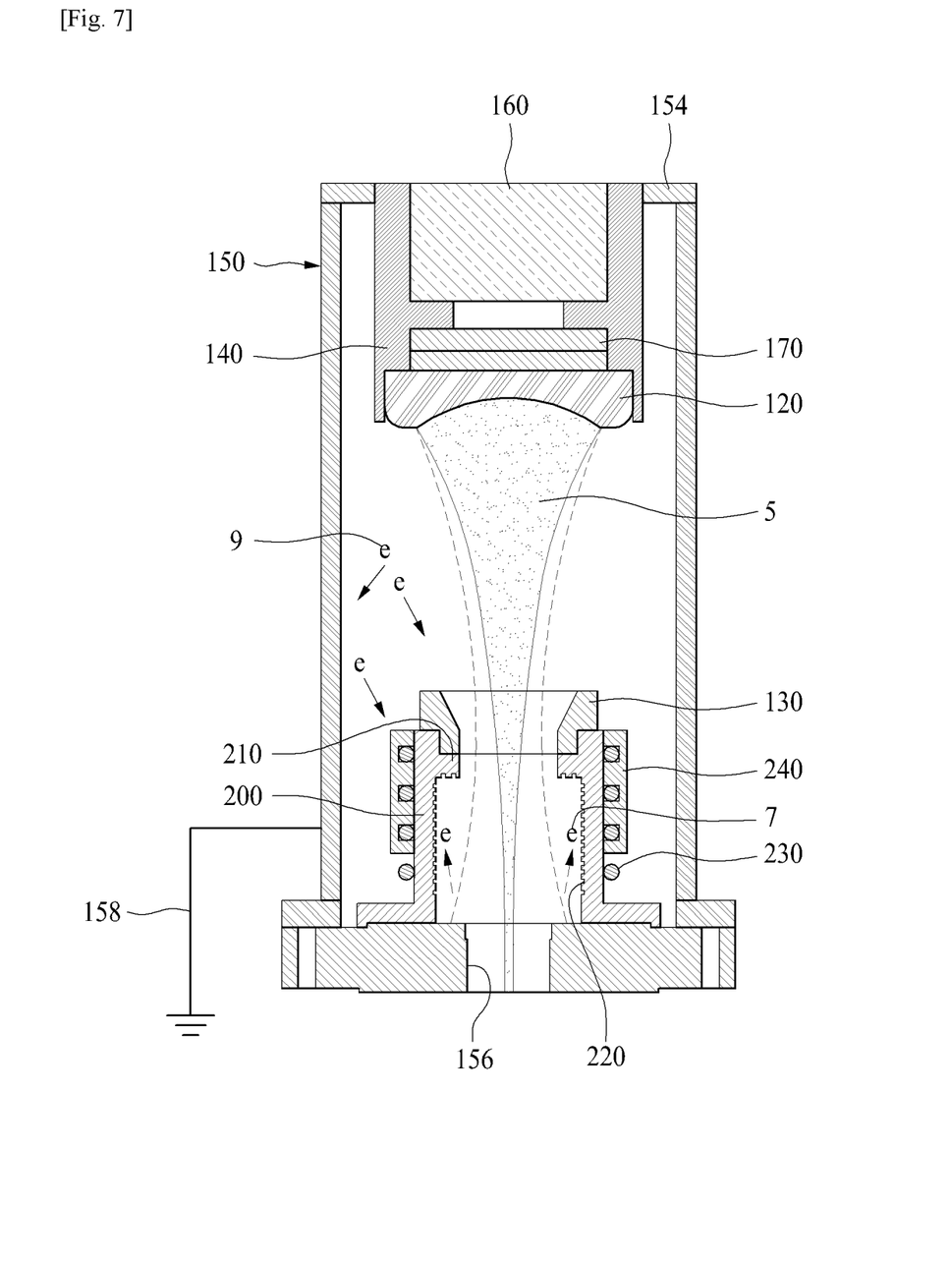
FIG. 7 is a cross-sectional view illustrating a state in which electron beams are emitted from the electron beam emission device in FIG. 3.

As illustrated in FIGS. 6 and 7, some electron beams at the outer periphery among electron beams 5 emitted from the cathode 120 cannot be directed toward the anode 130, but may form backscattered electrons (BSE) 7 that move in other directions.

In addition, secondary electrons 9 may be generated as elements such as nitrogen, which remain in the tube 152, collide with the accelerated electrons.

In the following description, both of the backscattered electron and the secondary electron are referred to as a reflection electron.

The reflection electrons 7 and 9 are not focused in comparison with the electron beams 5 passing through the anode 130 and thus do not have directionality, or may be scattered.

The reflection electrons 7 and 9 may heat the tube 152 or generate an arc by being reflected in the housing 150, and since the tube 152 of the electron beam emission device 100 of the present exemplary embodiment is made of a metallic material such as stainless steel, a geometric condition is changed when the tube 152 is heated and thermally expanded, and as a result, there may be a problem in that precision of the electron beam emission device 100 deteriorates.

Therefore, the reflection electron blocking structure 200 is a constituent element which blocks the reflection electrons 7 and 9 from moving toward the interior of the tube 152.

As illustrated in FIGS. 6 and 7, the reflection electron blocking structure 200 may be formed to extend toward the anode 130 from the periphery of the emission port 156 at a surface of the housing 150 in which the emission port 156 is formed.

Therefore, the reflection electron blocking structure 200 is disposed between the anode 130 and the surface in which the emission port 156 is formed, and may be formed in the form of a tube extending toward the anode 130 from the surface in which the emission port 156 is formed.

In this case, the reflection electron blocking structure 200 is opened at a side directed toward the anode 130 and at a side directed toward the emission port 156, and a hollow portion may communicate with the anode 130 and the emission port 156.

Therefore, the hollow portion of the reflection electron blocking structure 200 may serve as a passageway through which the electrons accelerated through the opening 132 of the anode 130 are emitted to the emission port 156.

In this case, the hollow portion may be formed coaxially with the emission port 156 so as to have a diameter larger than a diameter of the emission port 156, and may have a diameter equal to or smaller than a diameter of the opening 132 of the anode 130.

Further, the emission port 156 may be formed to have a diameter smaller than a diameter of the opening 132 of the anode 130.

In addition, a flange portion 210 may be formed to extend inward from an inner circumferential surface of the reflection electron blocking structure 200. The flange portion 210 may be formed on an upper portion of the reflection electron blocking structure 200, and a length to which the flange portion 210 protrudes may be set to such an extent as not to hinder the accelerated electrons from passing through the opening 132 of the anode 130 from passing through the reflection electron blocking structure 200.

In addition, metal vapor may be generated from molten metal when metal is processed by the electron beam emission device, and the metal vapor may flow into the housing 150 through the emission port 156 and may be deposited on the tube 152 or the insulation holder 140, thereby generating an arc. However, in a case in which the metal vapor is deposited on the surface of the cathode 120 which is formed concavely to have a gradient, the metal vapor may be vaporized by high energy of the electron beam without being deposited.

Therefore, a diameter of the flange portion 210 may be set to a diameter that allows the metal vapor flowing in through the emission port 156 not to be dispersed in the housing, but to be guided toward the surface of the cathode 120 which is formed concavely to have a gradient.

The accelerated electrons passing through the opening 132 of the anode 130 may be emitted to the emission port 156 of the housing 150 through the hollow portion of the reflection electron blocking structure 200.

Meanwhile, the reflection electrons 7 and 9 cannot pass through the emission port 156 of the housing 150, but may be reflected by the surface of the housing 150 in which the emission port 156 is formed.

In this case, the reflected electrons are reflected in the inner circumferential surface of the reflection electron blocking structure 200, and as a result, it is possible to prevent the reflected electrons from being reflected back to the tube 152.

Since the flange portion 210 extends inward from the inner circumferential surface, it is possible to prevent the electrons, which are reflected in the hollow portion of the reflection electron blocking structure 200, from escaping from the reflection electron blocking structure 200 to the outside from escaping to the outside of the reflection electron blocking structure 200, and the metal vapor flowing in through the emission port 156 is not dispersed in the housing, but is guided to be directed toward the surface of the cathode 120 which is formed concavely to have a gradient, and as a result, it is possible to prevent the metal vapor from being deposited on the tube 152 or the insulation holder 140.

In addition, a plurality of absorbing grooves 220 is formed in the inner circumferential surface of the reflection electron blocking structure 200, and the probability of a collision between the reflection electrons and the plurality of grooves is increased, and as a result, it is possible to absorb the electrons reflected in the hollow inner circumferential surface of the reflection electron blocking structure 200.

Meanwhile, the reflection electron blocking structure 200 may be heated by the reflection electrons 7 and 9, and a cooling pipe 230, through which a cooling medium flows, may be provided around an outer circumferential surface of the reflection electron blocking structure 200 in order to prevent the reflection electron blocking structure 200 from overheating.

The cooling medium may be water or other fluids that are advantageous in cooling the reflection electron blocking structure 200.

Therefore, the reflection electron blocking structure 200 may be cooled, and since the cooling pipe 230 is provided around the outer circumferential surface of the reflection electron blocking structure 200, even though the cooling medium leaks from the cooling pipe 230, the leaking cooling medium leaks between the tube 152 and the reflection electron blocking structure 200, and as a result, it is possible to prevent the cooling medium from leaking to the outside of the electron beam emission device through the anode 130 and the emission port 156.

Further, a blocking plate 240 is further provided outside the cooling pipe 230, and as a result, it is possible to block the reflection electrons 7 and 9 from being emitted directly to the cooling pipe 230, thereby preventing damage to the cooling pipe 230.

While the exemplary embodiments according to the present invention have been described above, it is obvious to those skilled in the art that the present invention may be specified in other particular forms in addition to the aforementioned exemplary embodiments without departing from the spirit or the scope of the present invention. Accordingly, it should be understood that the aforementioned exemplary embodiments are not restrictive but illustrative, and thus the present invention is not limited to the aforementioned description, and may be modified within the scope of the appended claims and the equivalent range thereto.

The invention claimed is:

1. An electron beam emission device comprising:
a housing which defines a space in which electron beams are accelerated, and has an opening at the other side thereof through which the electron beams are emitted;
a cathode which is disposed at one side in the housing, and emits the electrons;
an anode which is positioned in the housing so as to be spaced apart from the cathode toward the other side, and accelerates the electrons emitted from the cathode; and
an insulation holder which insulates a portion between the cathode and the housing, and fixes the cathode,
wherein the cathode has a surface which faces the anode and is formed concavely to have a gradient, and a rim of the surface of the cathode, which has the gradient, is formed to be rounded, and
where the insulation holder is formed to surround a rear surface of the surface of the cathode which has the gradient, surround a lateral surface of the cathode, and extend to the rounded portion of the rim of the cathode.

2. The electron beam emission device according to claim 1, wherein a surface of the cathode, which faces the anode, is disposed to the closer to the anode than the insulation holder.

3. The electron beam emission device according to claim 1, wherein a cooling unit, which cools the cathode in an air-cooled manner, is further provided between the cathode and the insulation holder.

4. The electron beam emission device according to claim 3, wherein the cooling unit includes an upper plate and a lower plate, and a flow path through which air flows is formed between the upper plate and the lower plate.

5. The electron beam emission device according to claim 1, further comprising:
a reflection electron blocking structure which is disposed in the housing, is formed to extend toward the anode from the periphery of an emission port of the housing, and blocks secondary electrons and backscattered electrons, which are reflected at the periphery of the emission port of the housing, from being reflected into the housing.

6. The electron beam emission device according to claim 5, wherein the reflection electron blocking structure is disposed between the anode and a surface of the housing in which the emission port is formed, extends toward the anode from the surface in which the emission port is formed, has an internal hollow portion, and is formed in the form of a tube that is opened at a side directed toward the anode and at a side directed toward the emission port.

7. The electron beam emission device according to claim 6, wherein the internal hollow portion of the reflection electron blocking structure communicates with the emission port, and has a diameter larger than a diameter of the emission port.

8. The electron beam emission device according to claim 7, wherein a flange portion, which extends inward from an inner circumferential surface of the reflection electron blocking structure, is further formed.

9. The electron beam emission device according to claim 8, wherein a diameter of an opening formed by an inner circumferential surface of the flange portion has a magnitude that allows metal vapor flowing upward through the emission port to be guided to the cathode.

10. The electron beam emission device according to claim 6, wherein a plurality of absorbing grooves, which absorbs the backscattered electrons and the secondary electrons, is formed in an inner circumferential surface of the reflection electron blocking structure.

11. The electron beam emission device according to claim 6, wherein a cooling pipe through which a cooling medium flows is provided on an outer circumferential surface of the reflection electron blocking structure.

12. The electron beam emission device according to claim 11, wherein a blocking plate, which blocks the electrons from being emitted directly to the cooling pipe, is further provided outside the cooling pipe.

13. An electron beam emission device comprising:
a housing which defines a space in which electron beams are accelerated, and has an opening at the other side thereof through which the electron beams are emitted;
a cathode which is disposed at one side in the housing, and emits the electrons;
an anode which is positioned in the housing so as to be spaced apart from the cathode toward the other side, and accelerates the electrons emitted from the cathode; and an insulation holder which insulates a portion between the cathode and the housing, and fixes the cathode, wherein the cathode has a surface which faces the anode and is formed concavely to have a gradient, and a rim of the surface of the cathode, which has the gradient, is formed to be rounded, and wherein a tube which is made of a metallic material and defines a lateral surface of the housing, is provided.

14. The electron beam emission device according to claim 13, wherein the tube is insulated from the cathode, and grounded.

15. An electron beam emission device comprising:

a housing which defines a space in which electron beams are accelerated, and has an emission port at the other side thereof through which the accelerated electron beams are emitted;

a cathode which is disposed at one side in the housing, and emits the electrons;

an anode which is positioned in the housing so as to be spaced apart from the cathode toward the other side, and accelerates the electrons emitted from the cathode; and a reflection electron blocking structure which is disposed in the housing, is formed to extend toward the anode from the periphery of the emission port of the housing, and blocks secondary electrons and backscattered electrons, which are reflected at the periphery of the emission port of the housing, from being reflected into the housing.

16. The electron beam emission device according to claim 15, wherein the reflection electron blocking structure is disposed between the anode and a surface of the housing in which the emission port is formed, extends toward the anode from the surface in which the emission port is formed, has an internal hollow portion, and is formed in the form of a tube that is opened at a side directed toward the anode and at a side directed toward the emission port.

17. The electron beam emission device according to claim 16, wherein the internal hollow portion of the reflection electron blocking structure communicates with the emission port, and has a diameter larger than a diameter of the emission port, and a flange portion, which extends inward from an inner circumferential surface of the reflection electron blocking structure, is further formed.

18. The electron beam emission device according to claim 16, wherein a plurality of absorbing grooves, which absorbs the backscattered electrons and the secondary electrons, is formed in an inner circumferential surface of the reflection electron blocking structure.

* * * * *